(12) United States Patent
Jeddeloh et al.

(10) Patent No.: US 10,714,150 B2
(45) Date of Patent: *Jul. 14, 2020

(54) FLEXIBLE MEMORY SYSTEM WITH A CONTROLLER AND A STACK OF MEMORY

(71) Applicant: Micron Technology, Inc., Boise, ID (US)

(72) Inventors: Joe M. Jeddeloh, Shoreview, MN (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/279,590

(22) Filed: Feb. 19, 2019

(65) Prior Publication Data
US 2019/0385646 A1  Dec. 19, 2019

Related U.S. Application Data

(63) Continuation of application No. 15/620,490, filed on Jun. 12, 2017, now Pat. No. 10,283,172, which is a
(Continued)

(51) Int. Cl.
*G11C 5/06*     (2006.01)
*G11C 5/14*     (2006.01)
(Continued)

(52) U.S. Cl.
CPC ............. *G11C 5/066* (2013.01); *G11C 5/025* (2013.01); *G11C 5/14* (2013.01); *G11C 7/10* (2013.01);
(Continued)

(58) Field of Classification Search
CPC ............. G11C 5/066; G11C 7/10; G11C 5/01
See application file for complete search history.

(56) References Cited

U.S. PATENT DOCUMENTS 7,889,578 B2   2/2011 Schuetz et al.
7,978,721 B2   7/2011 Jeddeloh et al.
(Continued)

FOREIGN PATENT DOCUMENTS

CN   100442503 C   12/2008
CN   101350345 A   1/2009
(Continued)

OTHER PUBLICATIONS

US 10,242,718 B2, 03/2019, Jeddeloh et al. (withdrawn)
(Continued)

*Primary Examiner* — Mohammed A Bashar
(74) *Attorney, Agent, or Firm* — Schwegman Lundberg & Woessner, P.A.

(57) ABSTRACT

Embodiments of a system and method for providing a flexible memory system are generally described herein. In some embodiments, a substrate is provided, wherein a stack of memory is coupled to the substrate. The stack of memory includes a number of vaults. A controller is also coupled to the substrate and includes a number of vault interface blocks coupled to the number of vaults of the stack of memory, wherein the number of vault interface blocks is less than the number of vaults.

9 Claims, 7 Drawing Sheets

Related U.S. Application Data continuation of application No. 13/919,503, filed on Jun. 17, 2013, now Pat. No. 9,679,615.

(60) Provisional application No. 61/791,182, filed on Mar. 15, 2013.

(51) Int. Cl.

| | | |
|---|---|---|
| *G11C 7/10* | (2006.01) | |
| *H01L 25/065* | (2006.01) | |
| *G11C 5/02* | (2006.01) | |
| *H01L 25/18* | (2006.01) | |
| *G11C 11/4063* | (2006.01) | |

(52) U.S. Cl.
CPC .......... *H01L 25/0657* (2013.01); *H01L 25/18* (2013.01); *G11C 11/4063* (2013.01); *H01L 2224/16225* (2013.01); *H01L 2225/06513* (2013.01); *H01L 2225/06517* (2013.01); *H01L 2924/0002* (2013.01); *H01L 2924/15192* (2013.01); *H01L 2924/15311* (2013.01)

(56) References Cited

U.S. PATENT DOCUMENTS

| | | | |
|---|---|---|---|
| 8,010,866 | B2 | 8/2011 | LaBerge et al. |
| 8,203,901 | B2 | 6/2012 | Jeddeloh |
| 9,679,615 | B2 | 6/2017 | Jeddeloh et al. |
| 10,283,172 | B2 | 5/2019 | Jeddeloh et al. |
| 2004/0257847 | A1 | 12/2004 | Matsui et al. |
| 2006/0071272 | A1 | 4/2006 | Alvarado et al. |
| 2007/0291557 | A1 | 12/2007 | Nishio et al. |
| 2007/0291830 | A1 | 12/2007 | Hori |
| 2008/0025124 | A1 | 1/2008 | Rajan et al. |
| 2009/0021974 | A1 | 1/2009 | Nonomura |
| 2009/0059641 | A1 | 3/2009 | Jeddeloh |
| 2009/0210600 | A1 | 8/2009 | Jeddeloh |
| 2009/0300269 | A1 | 12/2009 | Radke et al. |
| 2010/0014364 | A1 | 1/2010 | Laberge et al. |
| 2010/0042889 | A1 | 2/2010 | Hargan |
| 2010/0195421 | A1 | 8/2010 | Jeddeloh |
| 2010/0238693 | A1 | 9/2010 | Jeddeloh |
| 2011/0026303 | A1 | 2/2011 | Choi et al. |
| 2011/0161748 | A1 | 6/2011 | Casper et al. |
| 2011/0246746 | A1 | 10/2011 | Keeth et al. |
| 2012/0137040 | A1 | 5/2012 | Kim et al. |
| 2012/0284436 | A1 | 11/2012 | Casper et al. |
| 2012/0300555 | A1 | 11/2012 | Shin et al. |
| 2014/0281204 | A1 | 9/2014 | Jeddeloh et al. |
| 2016/0163377 | A1* | 6/2016 | Oh .................. G11C 11/40615 365/222 |
| 2017/0352388 | A1 | 12/2017 | Jeddeloh et al. |

FOREIGN PATENT DOCUMENTS

| | | |
|---|---|---|
| CN | 101946245 A | 1/2011 |
| CN | 102822966 A | 12/2012 |
| CN | 105144377 A | 12/2015 |
| CN | ZL201480023543.3 C | 9/2018 |
| CN | 109599134 A | 4/2019 |
| JP | 2003503855 A | 1/2003 |
| JP | 2005191172 A | 7/2005 |
| JP | 2006108670 A | 4/2006 |
| JP | 2008182229 A | 8/2008 |
| JP | 2011512598 A | 4/2011 |
| JP | 2012517066 A | 7/2012 |
| JP | 2013524519 A | 6/2013 |
| KR | 1020110131976 A | 12/2011 |
| KR | 1020130018812 A | 2/2013 |
| KR | 101756575 | 7/2017 |
| TW | 201515176 A | 9/2014 |
| TW | 201926612 A | 7/2019 |
| WO | WO-2011126893 A2 | 10/2011 |
| WO | WO-2014149851 A1 | 9/2014 |

OTHER PUBLICATIONS

"Chinese Application Serial No. 201480023543.3, Office Action dated Apr. 24, 2017", With English Translation, 29 pgs.
"Chinese Application Serial No. 201480023543.3, Office Action dated Dec. 22, 2017", w/English Translation, 8 pgs.
"Chinese Application Serial No. 201480023543.3, Response filed Mar. 5, 2018 to Office Action dated Dec. 22, 2017", w/ English Translation, 40 pgs.
"Chinese Application Serial No. 201480023543.3, Response filed Jun. 14, 2018 to Examiner Interview Summary", w/ English Translation, 40 pgs.
"Chinese Application Serial No. 201480023543.3, Response filed Sep. 8, 2017 to Office Action dated Apr. 24, 2017", w/English Claims, 20 pgs.
"European Application Serial No. 14767760.3, Communication Pursuant to Article 94(3) EPC dated Feb. 22, 2019", 5 pgs.
"European Application Serial No. 14767760.3, Extended European Search Report dated Jul. 20, 2016", 10 pgs.
"European Application Serial No. 14767760.3, Response filed Jul. 4, 2019 to Communication Pursuant to Article 94(3) EPC dated Feb. 22, 2019", w/ English Claims, 10 pgs.
"International Application Serial No. PCT/US2014/021211, International Preliminary Report on Patentability dated Sep. 24, 2015", 5 pgs.
"International Application Serial No. PCT/US2014/021211, International Search Report dated Jun. 26, 2014", 4 pgs.
"International Application Serial No. PCT/US2014/021211 , Written Opinion dated Jun. 26, 2014", 3 pgs.
"Japanese Application Serial No. 2016-500737, Office Action dated Sep. 6, 2016", W/ Machine Translation, 13 pgs.
"Japanese Application Serial No. 2016-500737, Response filed Oct. 18, 2016 to Office Action dated Sep. 6, 2016", W/ English Claims, 19 pgs.
"Korean Application Serial No. 10-2015-7029587, Office Action dated Oct. 25, 2016", with English Translation, 7 pgs.
"Korean Application Serial No. 10-2015-7029587, Response filed Dec. 23, 2016 to Office Action dated Oct. 25, 2016", 15 pgs.
"Taiwanese Application Serial No. 099137534, Voluntary Amendment filed Sep. 19, 2014", w/ English Claims, 29 pgs.
"Taiwanese Application Serial No. 103109311, Decision of Rejection dated Mar. 27, 2018", w/English Translation, 25 pgs.
"Taiwanese Application Serial No. 103109311, Office Action dated Aug. 9, 2017", w/ English Translation, 24 pgs.
"Taiwanese Application Serial No. 103109311, Response filed Nov. 13, 2017 to Office Action dated Aug. 9, 2017", w/English Translation, 26 pgs.
"Taiwanese Application Serial No. 107143387, Translation of Replacement Specification filed Apr. 3, 2019", w/ English Claim, 17 pgs.

\* cited by examiner

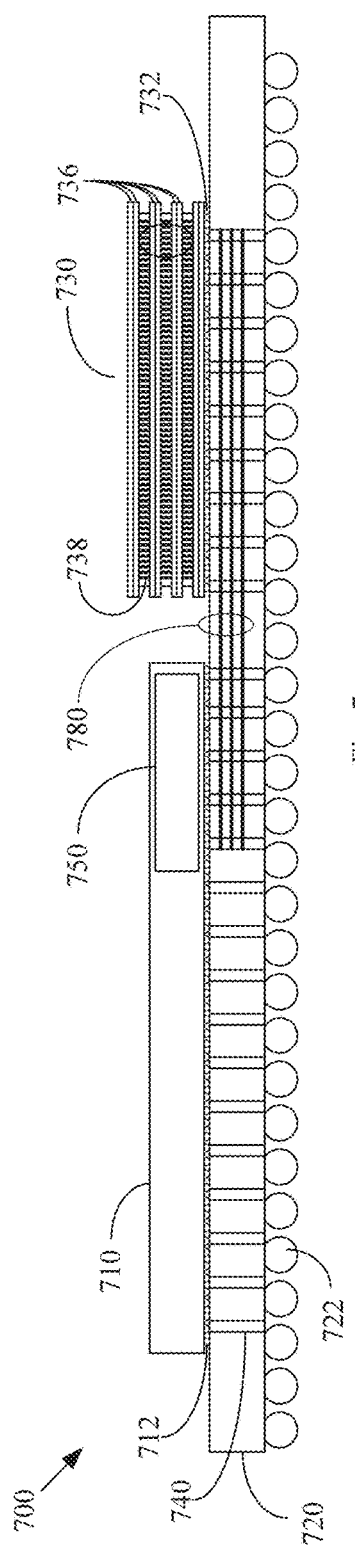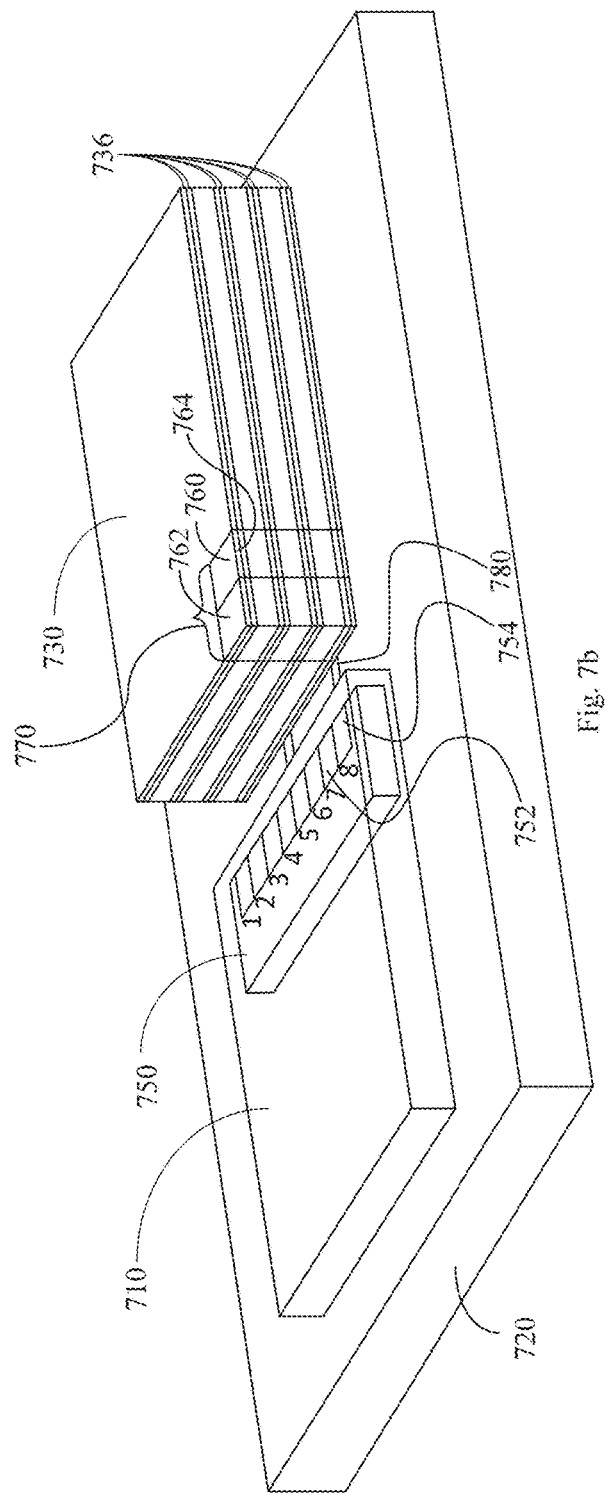

FLEXIBLE MEMORY SYSTEM WITH A CONTROLLER AND A STACK OF MEMORY

PRIORITY APPLICATION

This application is a continuation of U.S. application Ser. No. 15/620,490, filed Jun. 12, 2017, which is a continuation of U.S. application Ser. No. 13/919,503, filed Jun. 17, 2013, now issued as U.S. Pat. No. 9,679,615, which claims the benefit of priority to U.S. Provisional Application Ser. No. 61/791,182, filed Mar. 15, 2013, all of which are incorporated herein by reference in their entirety.

BACKGROUND

Memory bandwidth has become a bottleneck to system performance in high-performance computing, high-end servers, graphics, and (very soon) mid-level servers. Microprocessor enablers are doubling cores and threads-per-core to greatly increase performance and workload capabilities by distributing work sets into smaller blocks and distributing them among an increasing number of work elements, i.e. cores. Having multiple computer elements per processor results in an increasing amount of memory per computer element. This results in a greater need for memory bandwidth and memory density to be tightly coupled to a processor to address these challenges. Current memory technology roadmaps do not provide the performance to meet the central processing unit (CPU) and graphics processing unit (GPU) memory bandwidth goals.

To address the need for memory bandwidth and memory density to be tightly coupled to a processor, a hybrid memory cube (HMC) may be implemented so that memory may be placed on the same substrate as a controller enabling the memory system to perform its intended task more optimally. The HMC may feature a stack of individual memory die connected by internal vertical conductors, such as through-silicon vias (TSVs), which are vertical conductors that electrically connect a stack of individual memory die with a controller, such as to combine high-performance logic with dynamic random-access memory (DRAM). HMC delivers bandwidth and efficiencies while less energy is used to transfer data and provides a small form factor. In one embodiment of a HMC, the controller comprises a high-speed logic layer that interfaces with vertical stacks of DRAM that are connected using TSVs. The DRAM handles data, while the logic layer handles DRAM control within the HMC.

In other embodiments, a HMC may be implemented on, for example, a multi-chip module (MCM) substrate or on a silicon interposer. A MCM is a specialized electronic package where multiple integrated circuits (ICs), semiconductor dies or other discrete components are packaged onto a unifying substrate thereby facilitating their use as a component (e.g., thus appearing as one larger IC). A silicon interposer is an electrical interface routing between one connection (e.g., a socket) and another. The purpose of an interposer is to spread a connection to a wider pitch or to reroute a connection to a different connection.

However, the DRAM stack in a HMC has more bandwidth and signal count than many applications can use. The high signal count and high bandwidth of the DRAM stack in a HMC makes a cost effective host interface difficult.

BRIEF DESCRIPTION OF THE DRAWINGS

FIGS. 7a-b illustrate a flexible memory system according to an embodiment:

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass available equivalents of those claims.

A flexible memory system may be provided by tying vaults together (e.g., above, within or below the DRAM stack) to create a solution with a low contact count while keeping a low power profile. Herein, contacts refer to the leads, pins, solder balls or other types of interconnects that couple an integrated circuit to another device, such as a circuit board. Thus, leads, pins, solder balls or other types of interconnects may be used interchangeably.

Figure 1:
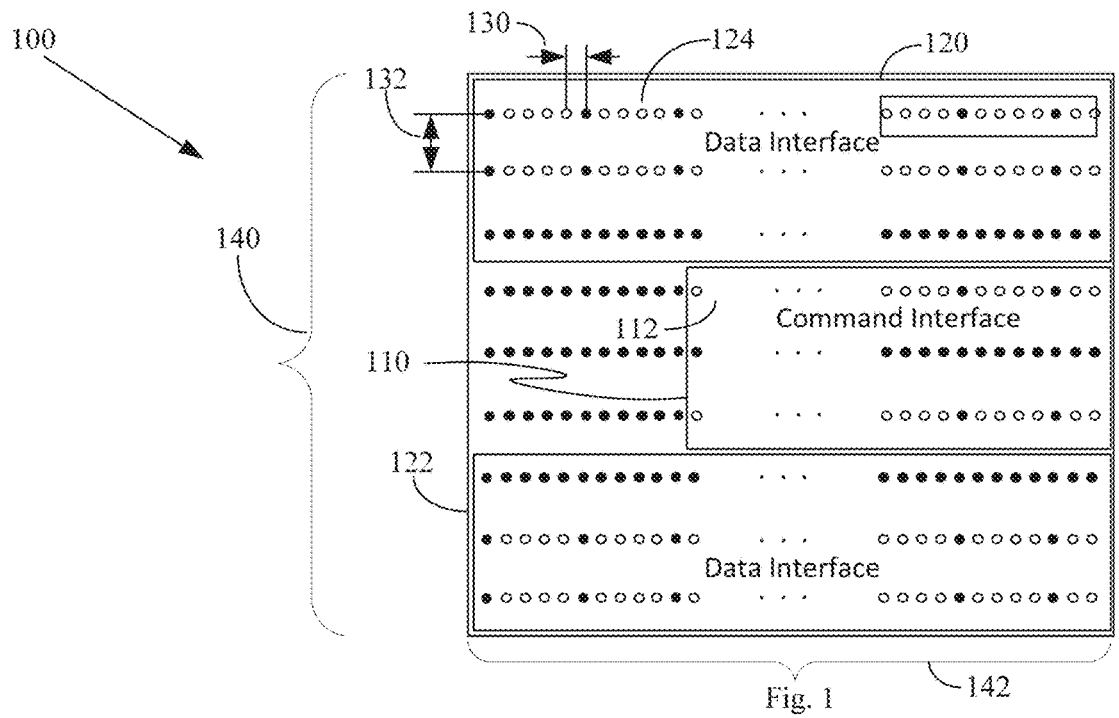
FIG. 1 illustrates a 72 bit vault for a flexible memory system according to an embodiment.

The flexible memory system provides a range of solutions from no vaults tied together for the highest bandwidth to tying the available vaults together for a low contact count solution. The low contact count solution can be applied to high density memory modules and low cost/low power system on a chip (SOC). FIG. 1 illustrates a 72 bit vault interface block 100 of a controller in a flexible memory system according to an embodiment. The 72 bit vault interface block 100 includes a command interface block (CIB) 110 and two data interface blocks (DIB) 120, 122. The CIB 110 includes contacts 112, including contacts for a first set of command signals, serial command signals and a second set of command signals. Two Data Interface Blocks (DIBs) 120, 122 are also illustrated in FIG. 1. Each of the DIBs 120, 122 provides a plurality of contacts 124, including contacts for data input/output (I/O), the data bus and timing signals.

A DRAM die may be segmented into multiple autonomous partitions, e.g. 16 partitions, e.g., see description of FIGS. 7A-B herein below. Each partition includes multiple independent memory banks, e.g., 2 to 8. Each partition is independent of the other partitions and autonomous in terms of data movement and command/addressing during normal operation. Memory vaults are essentially vertically interconnected partitions which result when partitioned DRAM die are stacked using TSVs and 3D integration. The command interfaces of the vaults of the vault pair may be tied together such that a vault pair shares a common command interface block of a vault interface block (e.g., below the DRAM stack) to create a solution having a low contact count while keeping a low power profile.

Considering ball grid arrays, for example, existing fine pitch flip-chip technologies may be used and may provide a 50 μm (130)×150 μm (132) contact pitch in a die package having a vault pitch in length 140 of 1.35 mm and a width 142 of 1.8 mm. The vault interface block 100 may be matched in width to the effective DRAM vault pitch to minimize the footprint on the controller.

Figure 2:
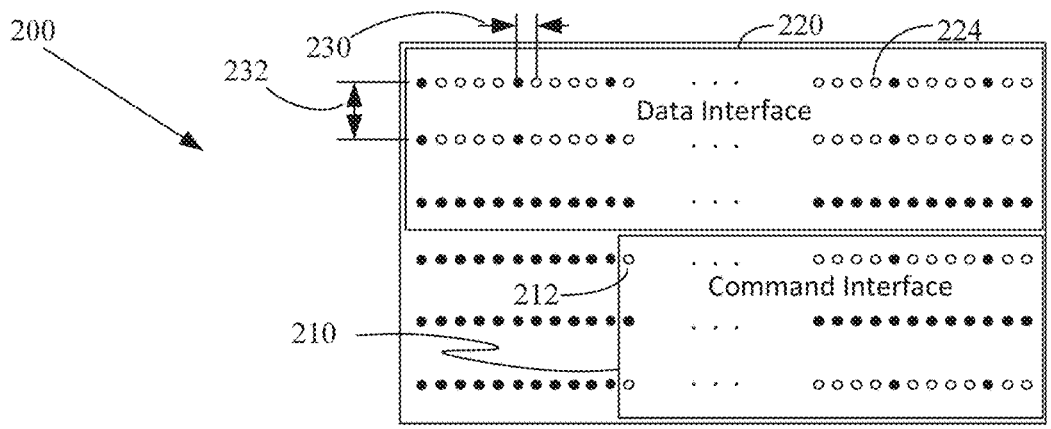
FIG. 2 illustrates a 36 bit vault for a flexible memory system according to another embodiment.

FIG. 2 illustrates a 36 bit vault interface block 200 of a controller in a flexible memory system according to another embodiment. In FIG. 2, one command interface block (CIB) 210 having contacts 212 and one data interface block (DIB) 220 having contacts 224 are shown. Contacts are represented by the unfilled circles. Existing fine pitch flip-chip technologies may be used to provide an appropriate contact pitch, e.g., 50 μm (230)×150 μm (232), in a die package having an appropriate vault pitch, e.g., a length 240 of 0.9 mm and a width 242 of 1.8 mm.

Figure 3:
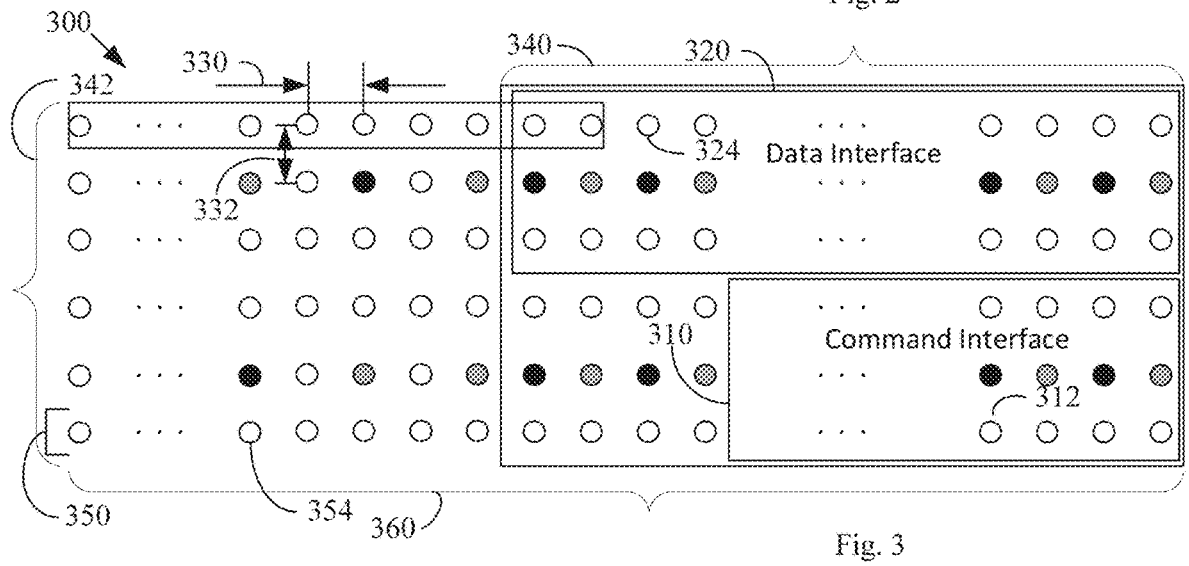
FIG. 3 illustrates a 36 bit vault for a flexible memory system according to another embodiment.

FIG. 3 illustrates a 36 bit vault interface block 300 of a controller in a flexible memory system according to another embodiment. In FIG. 3, one command interface block (CIB) 310 having contacts 312 and one data interface block (DIB) 320 having contacts 324 are shown. In the embodiment shown in FIG. 3, the contact field, which is the area of the die where the contacts are located, may include 6 rows of contacts 350. Unused contacts are merely presented to show that a larger die may be used to provide a 36 bit vault. Using a 150 μm (330)×150 μm (332) contact pitch, The 36 bit vault interface block 300 may have a length 340, e.g., of 0.9 mm, and width 342, e.g., of 1.8 mm. The area 360 of the total contact field may be 2.7 mm$^2$ (0.9 mm×3.0 mm).

Figure 4:
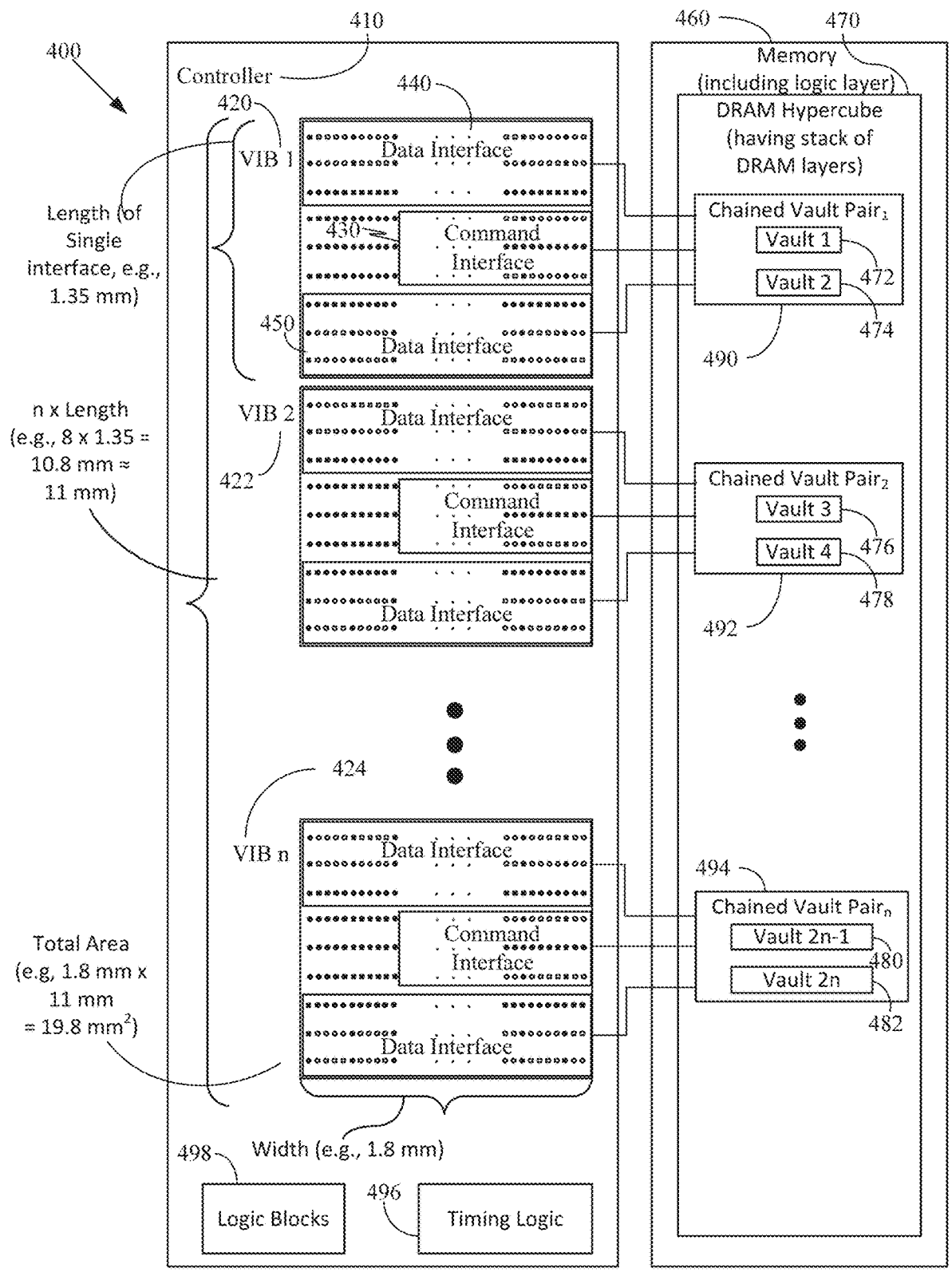
FIG. 4 illustrates a flexible memory system according to an embodiment.

FIG. 4 illustrates a flexible memory system 400 according to an embodiment. The flexible memory system 400 shown in FIG. 4 may include a controller 410 having a number n of 72 bit vault interface blocks. However, those skilled in the art will recognize that alternative vault interface blocks may be implemented. Pairing vaults using eight 36 bit vault interface blocks uses 21.6 mm2 die area for the contact field (i.e., 2.7 mm2×8).

In FIG. 4, the controller 410 includes a number of n 72 bit vault interface blocks 420, 422, 424 similar to the 72 bit vault interface block shown in FIG. 1. A 72 bit vault interface block 420, 422, 424 as shown in FIG. 4 may be implemented as vault interface block 100 as shown in FIG. 1. However, those skilled in the art will recognize other implementations of vault interface blocks may be used.

Each of the n 72 bit vault interface blocks 420, 422, 424 may include a command interface block (CIB) 430 and two data interface blocks (DIB) 440, 450. As described above, memory vaults may be formed by a stacked plurality of memory arrays and tied together (e.g., below the DRAM stack) to create a low contact count solutions while keeping a low power profile. As shown above with respect to FIG. 1, for example, existing fine pitch flip-chip technologies may be used to provide a contact pitch of 50 um×150 um contact pitch in a die package having an effective vault length of 1.35 mm and a width of 1.8 mm. However, those skilled in the art will recognize that alternative contact pitch, lengths and widths may be implemented. The vault interface blocks may be matched in width to the effective DRAM vault pitch to minimize the footprint on the controller.

As shown in FIG. 4, the n vault interface blocks 420, 422, 424 are included in the controller 410 provide a total length of n times the individual length of the vaults, e.g., n×1.35 mm=10.8 mm≈11.0 mm. Thus, the total area of the n vault interface blocks would be the total length times the width, e.g., 1.8 mm×11 mm=19.8 mm$^2$.

Memory 460 is also shown in FIG. 4. The memory 460 might comprise vertical stacks of DRAM die forming a DRAM hypercube 470. The vertical stacks of DRAM are connected together using through-silicon-via (TSV) interconnects (not shown, see FIGS. 8a-b). Vaults 472, 474 of the DRAM hypercube 470 are tied together to form vault pair 490. Vaults 476, 478 and vaults 480, 482 are tied together to form vault pairs 492, 494, respectively. Thus, a vault interface block (e.g., VIB 1 420) may serve both pairs of vaults (e.g., Vault 1 472 and Vault 2 474) of a vault pair (e.g., vault pair 490). Although the preceding embodiments discuss tying together pairs of vaults to share a vault interface block, embodiments are not limited thereto, as any number of vaults might be tied together to share a vault interface block. Each pair of vaults is depicted as sharing a command interface block.

The DRAM hybrid memory cube (HMC) 470 provides memory on the same substrate as a controller. As described above with reference to FIG. 1, each of the DIBs 440, 450 of vault interface block 420, for example, may provide contacts, including contacts for data input/output (I/O), the data bus and timing signals. Logic blocks 498 may be associated with each of the vault interface blocks 420. Logic may alternatively be provided at the DRAM hypercube 470. An ASIC (see FIGS. 7a-b) may implement logic blocks 498 associated with the vault interface blocks 420. The logic blocks 498 provide host interface logic for processing signals between a host and the DRAM hypercube 470. Data is handled by the DRAM hypercube 470, while the logic blocks 498 handle control of the DRAM hypercube 470. For example, the number of contacts may be reduced by including timing logic 496. While shown separately in FIG. 4, the timing logic may be included in logic blocks 498. Timing logic 496 may be used to determine whether a request is destined to a particular one of the vaults 472-482. In some embodiments, the timing logic 496 may comprise timing and chip select logic.

A low power solution may be obtained by slightly increasing the individual input/output (10 or I/O) buffer drive strength versus generating power for an interconnect that multiplexes vaults 472, 474, vaults 476, 478, and vaults 480, 482, respectively. Signal count can be further reduced by combining the address/command bus with a data line (DQ) bus and use of a header. This resembles a packet interface to the DRAM hypercube 470. The first few clocks of the request involve a command header. This is followed by write data for a write command. A very low contact count solution is useful for large modules. Increased bandwidth may be obtained through the use of multiple stacks. The buffer cost and density of the module is driven by the signal count to the DRAM hypercube 470. Thus, a reduction in contact count reduces the buffer cost and density.

Thus, the DRAM hypercube 470 provides a flexible method to configure a host physical layer and multi-chip module (MCM) interconnect for a wide range of solutions. The highest bandwidth may be provided by not tying all the vaults 470-782 together, whereas a low pin count solution may be provided by tying all the vaults 470-782 together. Accordingly, the low pin count solution can be applied to high density memory modules and low cost/low power SOC's.

Figure 5:
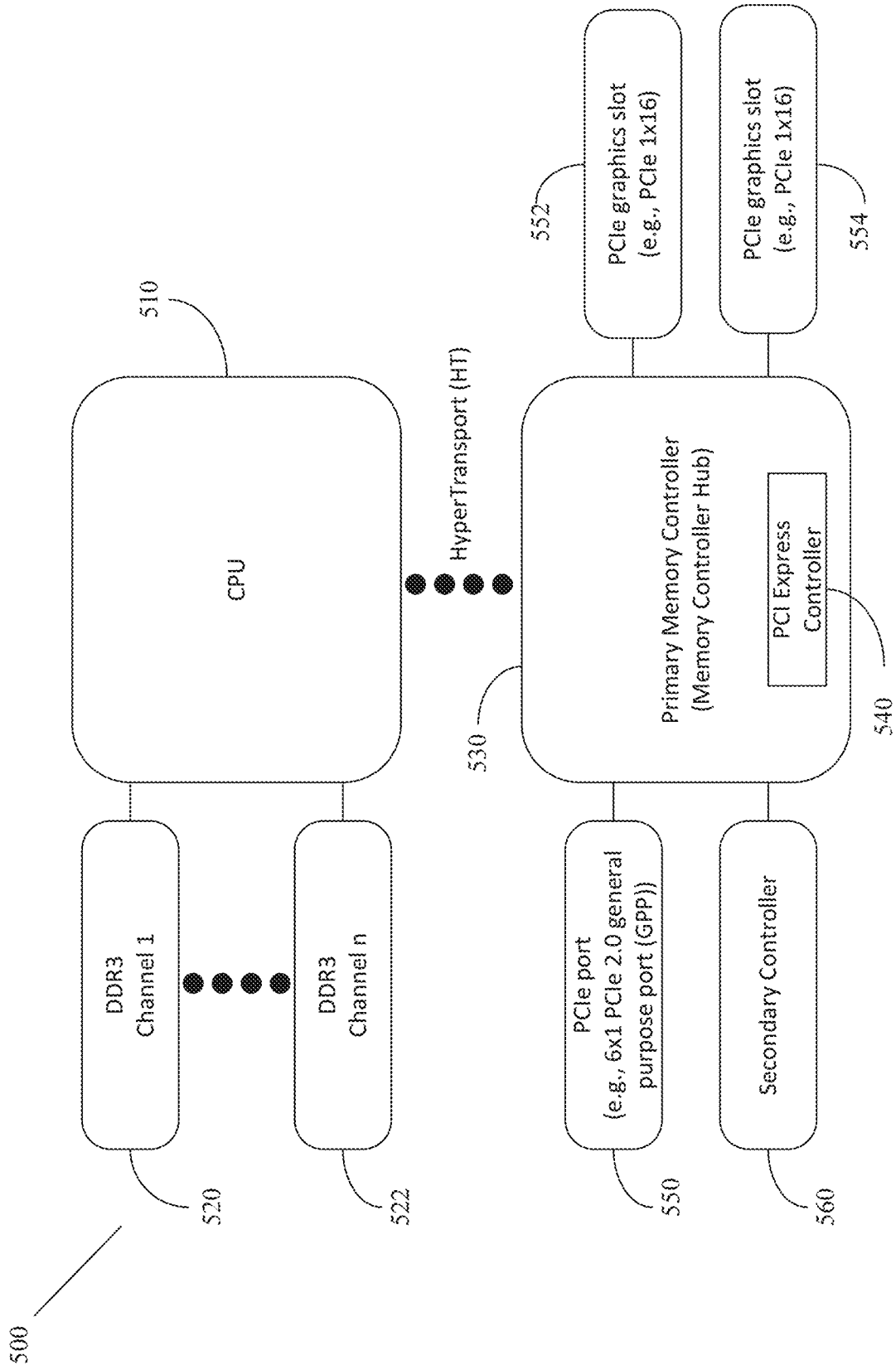
FIG. 5 illustrates a block diagram of a computer system according to an embodiment.

FIG. 5 illustrates a block diagram of a computer system 500 according to an embodiment. In FIG. 5, a CPU 510 is coupled to double data rate type three (DDR type 3 or simply DDR3) dynamic random access memory (DRAM) 520, 522. The CPU 510 is also coupled to a primary memory controller 530, e.g., Northbridge. The primary memory controller 530 may include a Peripheral Component Interface (PCI) Express controller 540 and handle communications between the CPU 510, PCI-E (or accelerated graphics processor (AGP)) video adapters 550, 552, 554, and a secondary memory controller 560.

Figure 6:
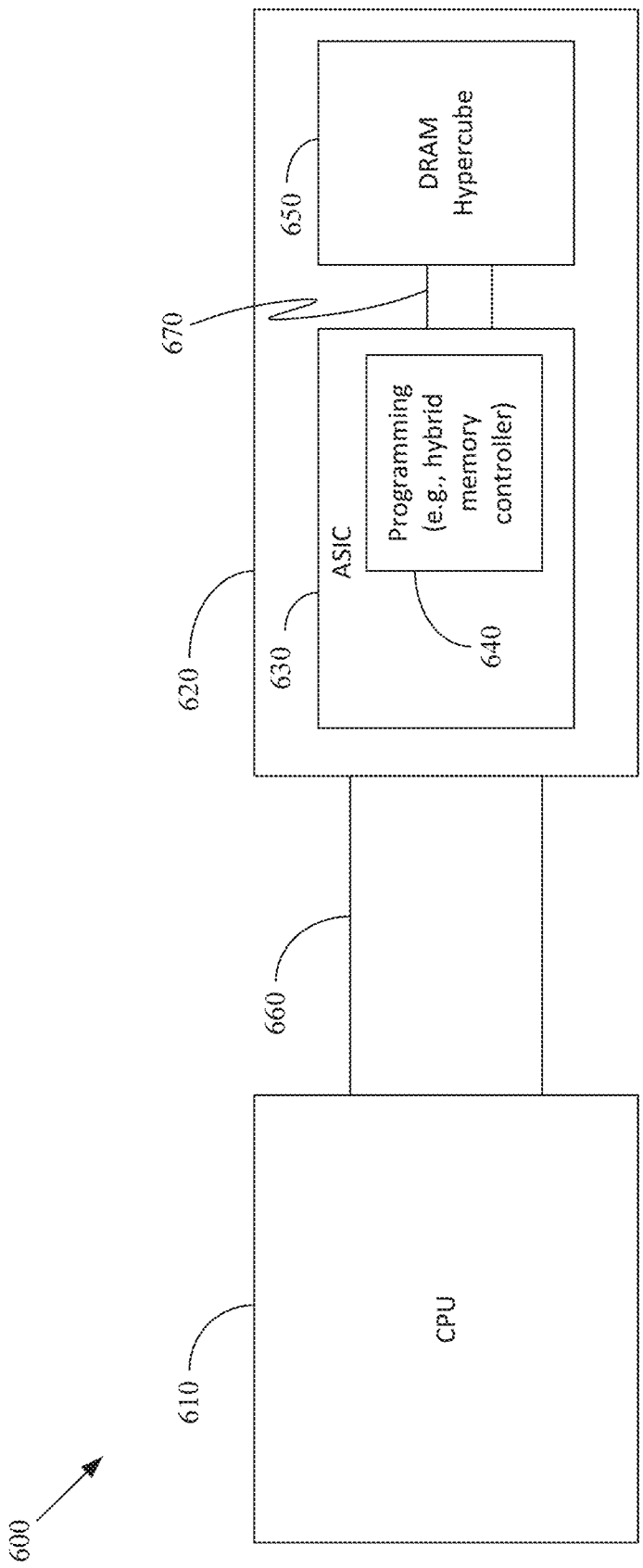
FIG. 6 illustrates a block diagram of another computer system.

FIG. 6 illustrates a computer system 600 according to an embodiment. In FIG. 6, the CPU 610 is coupled to the flexible memory system 620. The flexible memory system includes a controller, such as a controller implemented in an application specific integrated circuit (ASIC) 630 that includes logic blocks corresponding to vault interface blocks 640, and a DRAM hypercube 650. An ASIC 630 may be used to allow customization for a particular use, rather than using a general processor arranged for general-purpose use. The flexible memory system 620 can be coupled to the processor core through a high speed link 660, e.g., a serialize/deserialize (SERDES) data link. A high speed link 670 may also be used to couple the DRAM hypercube 650 to the ASIC 630.

FIGS. 7a-b illustrate a flexible MCM memory system 700 according to an embodiment. In FIGS. 7a-b, an ASIC 710 is mounted to a MCM substrate 720. A DRAM hypercube 730 is also mounted to the MCM substrate 720.

The DRAM hypercube 730 may include multiple DRAM die 736 that are stacked using through-silicon vias (TSVs) 738. Signals from the connections 712 of the ASIC 710 and the connections 732 of the DRAM hypercube 730 flow through blind vias that do not fully penetrate the MCM substrate 720. The blind vias only go deep enough to reach a routing layer. Other signals from either the ASIC or DRAM which need to connect to the system through solder balls 722 will use vias that fully penetrate the MCM substrate. The MCM memory system 700 provides a specialized electronic package where multiple integrated circuits (ICs), semiconductor dies or other discrete components are packaged onto a unifying substrate, thereby facilitating their use as a component (e.g., appearing as one larger IC). The ASIC 710 may also include logic blocks 750 corresponding to vault interface blocks. The logic blocks 750 may provide host interface logic for processing signals between a host (e.g., CPU 710 in FIG. 7) and the DRAM hypercube 730 and control logic for controlling the DRAM hypercube.

In some embodiments, the functionality of a logic layer may be implemented at the ASIC 710, e.g., in logic blocks 750. Thus, the DRAM hypercube 730 may not include a high-speed logic layer coupled to the vertical stacks of DRAM 736. However, in other embodiments, the DRAM hypercube 730 may include a high-speed logic layer that is coupled to the vertical stacks of DRAM 736.

The DRAM 736, along with the logic blocks 750, may handle data and DRAM control within the hypercube 730. The TSVs 738 that pass through the DRAM 736 provide a high level of concurrent connections. Memory access by the controller 710 is carried out on a highly efficient interface 780 that supports high transfer rates, e.g., 1 Tb/s or more.

Referring to FIG. 7b, one or more of the plurality of stacked DRAM die 736 may be segmented into multiple autonomous partitions 764, e.g. 16 partitions. Each partition 764 includes multiple independent memory banks, e.g., 2 to 8. Each partition 764 is independent of the other partitions and autonomous in terms of data movement and command/addressing during normal operation. Memory vaults 760, 762 are essentially vertically interconnected partitions 764 that result when partitioned DRAM die are stacked using TSVs 736.

Vaults 760, 762 of the DRAM hypercube 730 are paired to form vault pair 770. Thus, the vault pair 770 serves one of vault interface blocks 1-8 (e.g., 752) of the controller 710. However, those skilled in the art will recognize that a different number of vault interface blocks may be implemented. Moreover, vault blocks 1-8 may be tied together in pairs, fours, eights, etc., depending on the number of vault interface blocks to which they will be coupled, for example.

Referring to FIG. 4 and FIGS. 7a-b, clock signals may be reduced by including timing logic 496, whether on a separate logic layer in the hypercube 730 or on the DRAM 736 itself, as may be the case when a separate logic layer is not included in the hypercube 730. Timing logic 496 may snoop and analyze clock signals from ASIC 710 to identify a vault targeted by a request, e.g., to determine whether a particular request is destined to a particular vault. For example, timing logic 496 may determine that a request is destined to vault 760 rather than vault 762. Responsive to identifying a targeted vault, the timing logic 496 activates the targeted vault to receive the request and to return data. The timing logic 496 may thus reduce clock count by analyzing the clock signals. Host interface logic block 750 may be used to save the adjust timing for a clock signal targeted to an identified vault and adjust the clock signal according to the identified vault. The timing logic 496 is very low power.

Figure 8:
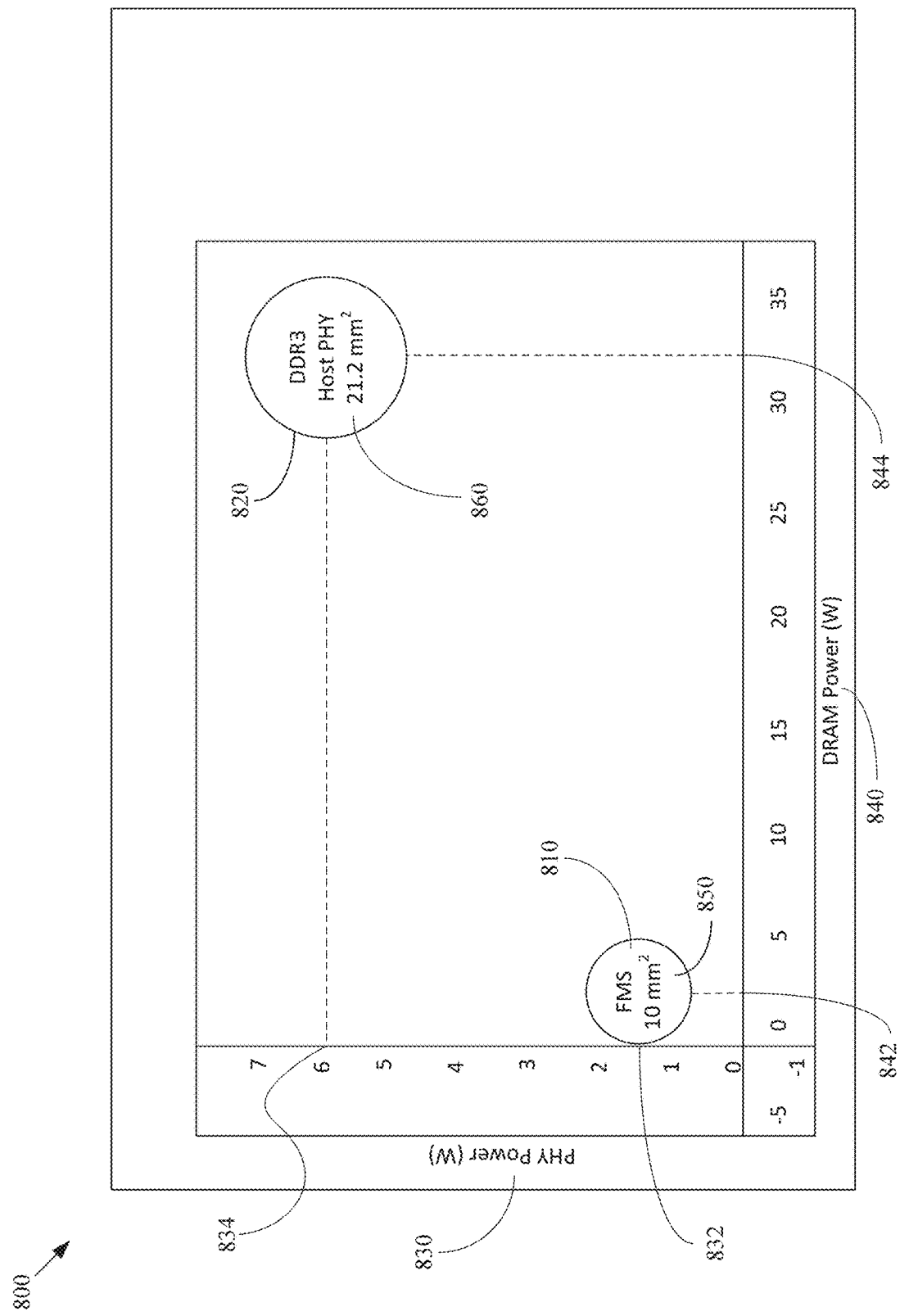
FIG. 8 is a plot showing the power savings according to an embodiment.

FIG. 8 is a plot 800 showing the power savings according to an embodiment. In FIG. 8, the flexible memory system 810 is compared to a DDR3 memory system 820 in terms of host physical power (PHY) 830 and the DRAM power 840. The flexible memory system 810 requires a host PHY power 830 of approximately 1.5 watts 832 and requires a DRAM power 840 of approximately 2.5 watts 842. In contrast, the DDR3 memory system 820 requires a host PHY power 830 of approximately 6.0 watts 834 and requires a DRAM power 840 of approximately 33 watts 844. The flexible memory system 810 has an area of 10 mm$^2$ 850 while the DDR3 memory system 820 has an area of 21.2 mm$^2$ 860. Thus, the flexible memory system 810 enables the implementation of a lower contact count while maintaining a lower power profile than the DDR3 memory system 820.

Figure 9:
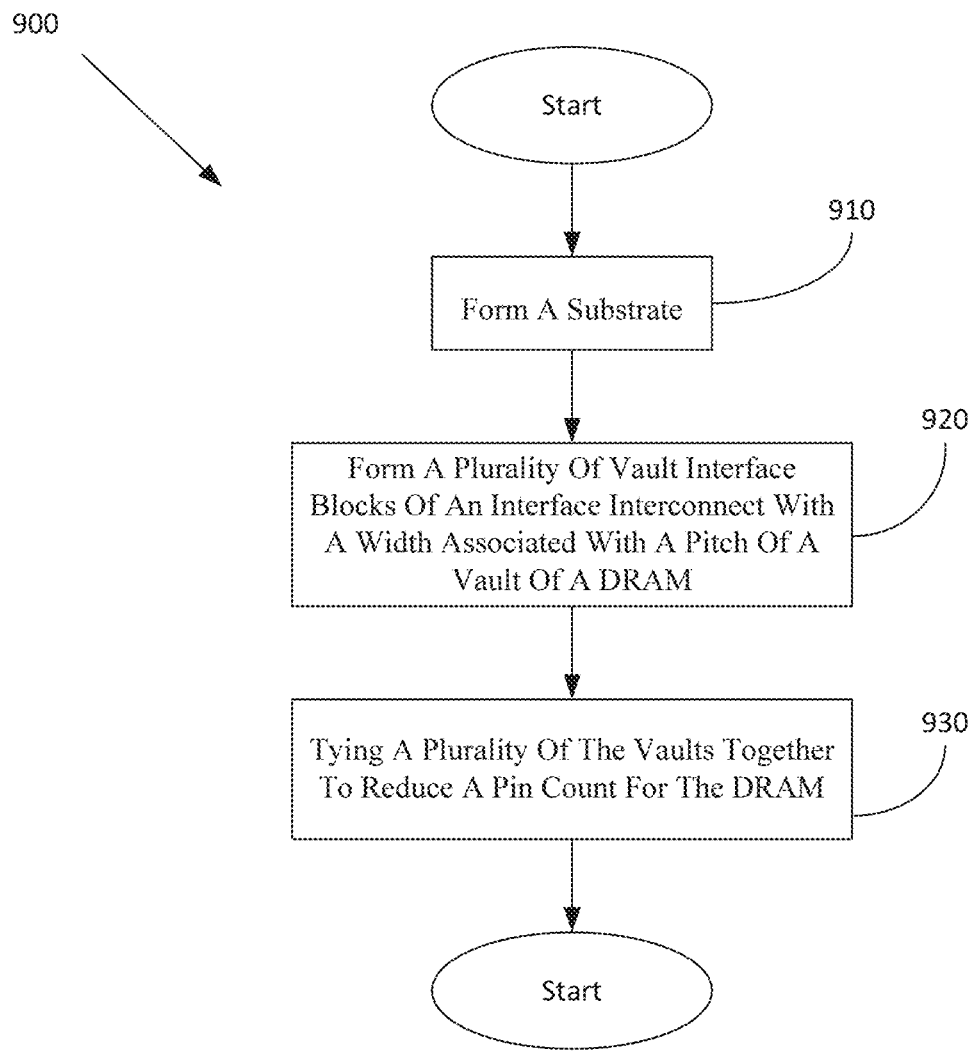
FIG. 9 is a flowchart of a method for forming a flexible memory system according to an embodiment.

FIG. 9 is a flowchart 900 of a method for forming a flexible memory system according to an embodiment. In block 910, a substrate is formed. In block 920, a plurality of vault interface blocks of an interface interconnect are formed with a width associated with a pitch of a vault of a DRAM. In block 930, a plurality of the vaults are tied together to reduce a contact count for the DRAM.

The above detailed description includes references to the accompanying drawings, which form a part of the detailed description. The drawings show, by way of illustration, specific embodiments that may be practiced. These embodiments are also referred to herein as "examples." Such examples can include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, just as if individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is to allow the reader to quickly ascertain the nature of the technical disclosure, for example, to comply with 37 C.F.R. § 1.72(b) in the United States of America. It is submitted with the understanding that it will not be used to interpret or limit the scope or meaning of the claims. Also, in the above Detailed Description, various features may be grouped together to streamline the disclosure. An unclaimed disclosed feature is not to be interpreted essential to any claim. Rather, embodiments may include fewer features than those disclosed in a particular example. Thus, the following claims are hereby incorporated into the Detailed Description, with an individual claim standing on its own as a separate embodiment. The scope of the embodiments disclosed herein is to be determined with reference to the appended claims, along with the full scope of equivalents to which such claims are entitled.

What is claimed is:

1. A memory system, comprising:
   multiple DRAM memory die stacked above a substrate,
   wherein each die includes multiple partitions which operate independently from other partitions, and
   wherein multiple vertically interconnected partitions of the stack are interconnected to form multiple respective memory vaults; and
   a controller supported by the substrate and configured to interface with a first memory vault through a first group of data interface contacts, to interface with the second memory vault through a second group of data interface contacts, and to interface with at least the first and second memory vaults through a shared group of command interface contacts.

2. The memory system of claim 1, wherein the stack of multiple memory die comprises timing logic arranged to analyze received clock signals to identify a memory vault targeted by a received request.

3. The memory system of claim 2, wherein the timing logic is further configured to activate the targeted vault in response to identifying the vault as being targeted by the request.

4. The memory system of claim 1, in which the controller includes logic blocks configured to provide host interface logic for processing signals between a host and the multiple stacked DRAM die.

5. A memory system, comprising:
   multiple DRAM memory die stacked above a substrate,
      each die having multiple partitions which operate independently from other partitions as to data movement, and
      wherein multiple vertically arranged partitions of two or more die in the stack are interconnected by through silicon vias (TSVs) to form multiple respective memory vaults; and
   a controller supported by the substrate and configured to interface,
      with partitions of a first memory vault through a first group of data interface contacts,
      with partitions of a second memory vault through a second group of data interface contacts, and
      with partitions of the first and second memory vaults through a shared group of command interface contacts.

6. The memory system of claim 5, wherein the memory system comprises timing logic arranged to snoop clock signals to determine a memory vault to which a request is directed.

7. The memory system of claim 5, wherein the controller is arranged to tailor timing for a clock signal for a targeted memory vault.

8. The memory system of claim 5, wherein the controller is configured to train timing for each memory vault.

9. The memory system of claim 5, wherein the memory system comprises timing logic arranged to analyze clock signals received from the controller to identify a memory vault targeted by a request.

* * * * *